United States Patent [19]

Machado

[11] Patent Number: 5,561,478
[45] Date of Patent: Oct. 1, 1996

[54] TRI-STATE CONTROLLED VIDEO SWITCH

[75] Inventor: Edward Machado, Northbrook, Ill.

[73] Assignee: Zenith Electronics Corporation, Glenview, Ill.

[21] Appl. No.: 587,194

[22] Filed: Jan. 16, 1996

[51] Int. Cl.⁶ .................................................. H04N 5/44
[52] U.S. Cl. ................................. 348/706; 326/56
[58] Field of Search .................... 326/56–58; 348/705, 348/706, 385; 327/407, 411, 413

[56] References Cited

U.S. PATENT DOCUMENTS 3,056,039  9/1992  Onyskevych ..................... 326/56 X
5,255,097  10/1993  Spiero et al. .................. 348/705 X Primary Examiner—Victor R. Kostak
Assistant Examiner—Nathan J. Flynn

[57] ABSTRACT

A tri-state controlled video switch includes three switch transistors, each being coupled to a common output line and each being supplied with a different video input signal. A microprocessor controls the voltage condition on a control line. In response to a high, low or open voltage condition on the control line, an arrangement of transistors controls the operation of the switch transistors such that only a corresponding one of the three video signals is coupled to the common output line.

6 Claims, 2 Drawing Sheets

TRI-STATE CONTROLLED VIDEO SWITCH

This invention relates generally to television receivers and particularly to a video switch for coupling any one of three television video signals to a common output terminal.

Most modern television receivers include microprocessors for controlling the functions of the receiver. The receiver circuitry is also, in large measure, incorporated into a number of integrated circuits (IC's) which, while being highly beneficial from a size, uniformity and cost standpoint, restrict changes in functionality, and limit the addition of features to the receiver. In the present invention, the controlling microprocessor is incorporated in a microprocessor IC module that has a finite number of "pin outs" available. The invention enables the use of a single pin on the microprocessor IC module to switch among three video sources.

OBJECTS OF THE INVENTION

A principal object of the invention is to provide a novel three way video switch.

Another object of the invention is to provide a video switch that requires only a single control input.

A further object of the invention is to provide a low cost three way video switch for a microprocessor controlled television receiver.

BRIEF DESCRIPTION OF THE DRAWINGS

These and other objects of the invention will be apparent upon reading the following description in conjunction with the drawings in which.

DESCRIPTION OF THE PREFERRED EMBODIMENT

Figure 1:
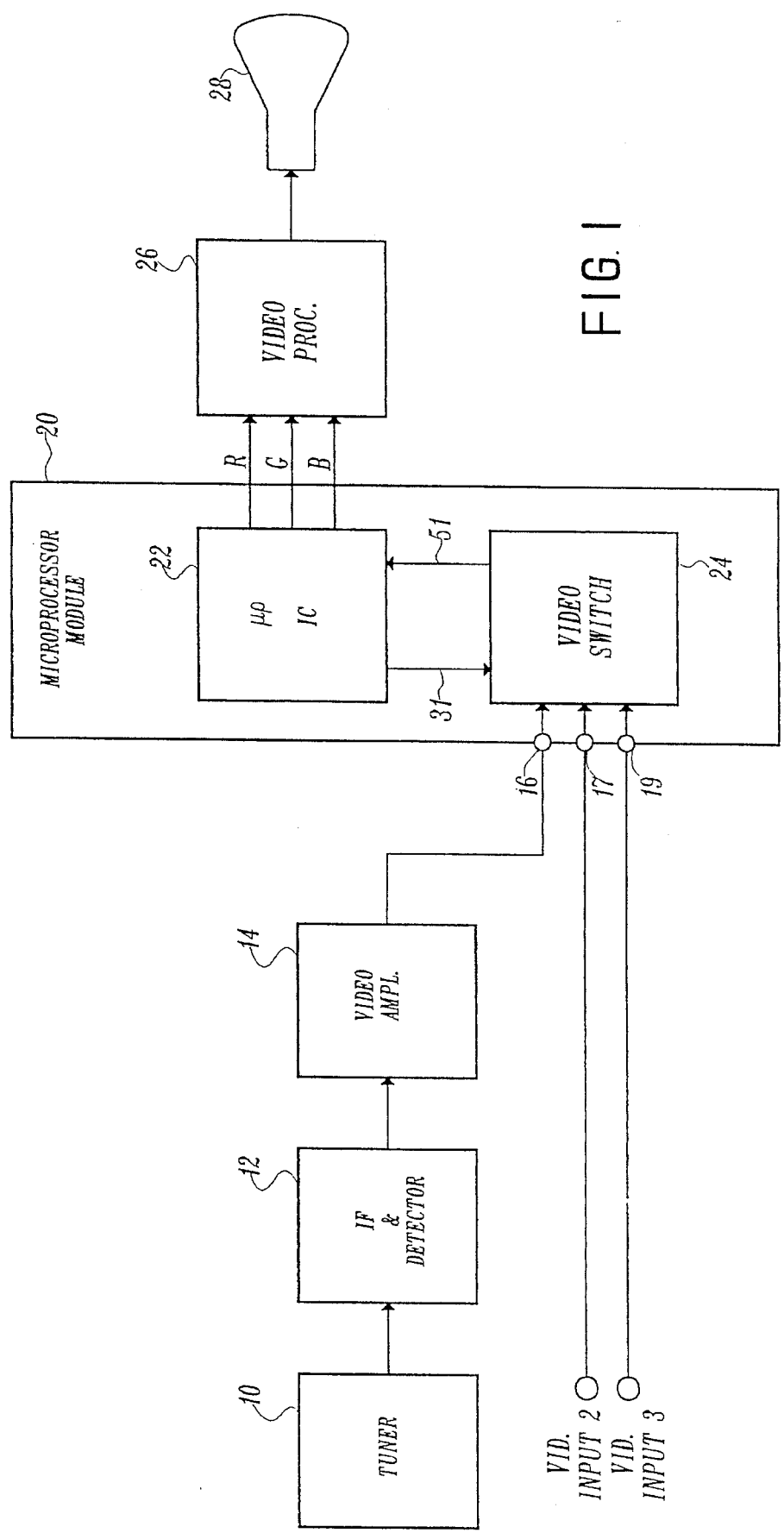
FIG. 1 is a simplified block diagram of a television receiver incorporating the invention.

Referring to FIG. 1, a tuner 10 for receiving a broadcast or cable television signal is coupled to an IF & detector 12 where the signal is demodulated and applied to a video amplifier 14. The output of video amplifier 14 constitutes a first video input signal that is applied to a terminal 16 on a microprocessor module 20 that includes a microprocessor IC 22 and a video switch 24. Specifically, terminal 16 couples the first video input signal to video switch 24. Second and third video input signals are coupled by terminals 17 and 19, respectively, to video switch 24. The microprocessor (not shown) in IC 22 controls video switch 24 via a single control line 31 and the selected one of the three video input signals is supplied to IC 22 via a common output line 51, as discussed in detail below. IC 22 supplies three color signals R, G and B to a video processor 26 that in turn supplies signals to a cathode ray picture tube 29. All aspects of the foregoing television receiver, except for the video switch 24, are conventional and well known in the art.

Figure 2:
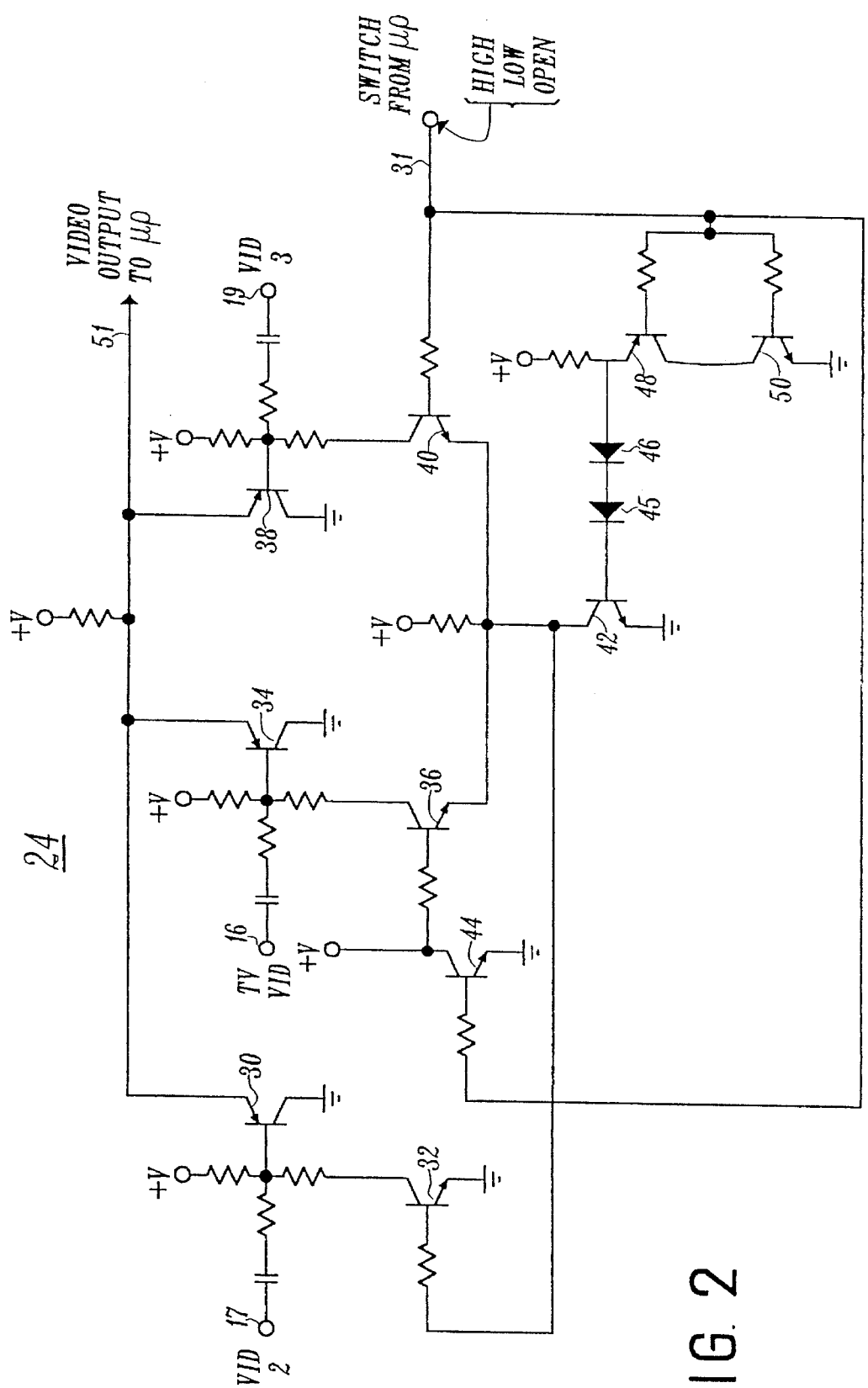
FIG. 2 is a schematic diagram of the video switch of the invention.

The schematic diagram of FIG. 2 illustrates the details of video switch 24. Three transistor switches, comprising PNP transistors 30, 34 and 38, having their emitter-collector circuits connected to common output line 51, are shown. These switch transistors 30, 34 and 38 are in turn controlled or operated by switch control NPN transistors 32, 36 and 40, respectively, which determine the particular transistor switch that is driven conductive to supply its base-coupled video signal to the common output line 51. Selection of the video signal to be coupled is accomplished by the microprocessor establishing a high, low or an open (tri-state) voltage condition on control line 31. The control line voltage conditions are converted by NPN transistors 42, 44, 48 and 50, and diodes 45 and 46, into appropriate control voltages for the switch control transistors 32, 36 and 40.

In operation, when the control line 31 is low, transistor 48 is turned on and transistor 50 is turned off. Since transistors 48 and 50, which are of opposite type are cascaded with their collectors connected together, neither conducts when one of them is cut off. Therefore the voltage at the emitter of transistor 48 remains at +V (5.0 volts). This turns on transistor 42, which turns off switch control transistor 32 and enables switch control transistors 36 and 40. With switch control transistor 32 off, the base of switch transistor 30 rises to +V and switch transistor 30 is turned off, preventing the second video input signal from going through to the common output line 51. Also, when control line 31 is low, switch control transistor 40 is turned off, thus permitting the base of switch transistor 38 to rise to +V, turning switch transistor 38 off and preventing the third video input signal from going through to the common output line 51. Simultaneously, transistor 44 is turned off when control line 31 is low, which turns on switch control transistor 36, thus lowering the base voltage of switch transistor 34 to approximately 1.0 volts, turning switch transistor 34 on and permitting the television video signal (the first video input signal) to be coupled to the common output line 51.

Considering the operation when control line 31 goes high, transistor 50 is turned on, but transistor 48 is turned off. Consequently, the voltage on the emitter of transistor 48 remains at +V, turning on transistor 42, enabling switch control transistors 36 and 40 and turning switch control transistor 32 off. Thus, the second video input signal is prevented from going through to common output line 51. Switch control transistor 40 is turned on when control line 31 is high, causing the base of switch transistor 38 to fall to approximately 1.0 volt, turning switch transistor 38 on and allowing the third video input signal to be coupled to common output line 51. The first video input signal (the television signal) is prevented from going through since its switch transistor 34 is turned off because when control line 31 goes high, it drives transistor 44 into conduction, turning off switch control transistor 36 which places +V on the base of switch transistor 34.

The last voltage condition is an "open" on control line 31, corresponding to a high impedance mode (tri-state). Under this condition, both transistors 48 and 50 turn on, causing the emitter of transistor 48 to fall to approximately 1.4 volts. This voltage is applied through diodes 45 and 46, which impose a voltage drop of about 1.4 volts, which therefore produces a zero voltage level at the base of transistor 42, turning it off. The voltage at the collector of transistor 42 rises to +V and disables switch control transistors 36 and 40, cutting off switch transistors 34 and 38, respectively, and preventing the television video signal and the third video input signal from being coupled to common output line 51. When transistor 42 is off, switch control transistor 32 is driven conductive and, in turn, causes switch transistor 30 to conduct and couple the second video input signal to the common output line 51. Thus, switching among the three video signals is accomplished in response to the three voltage conditions on the single control line 31.

It is recognized that those skilled in the art will readily perceive various changes to the described embodiment of the invention without departing from its true spirit and scope. The invention is to be limited only as defined in the claims.

I claim:

1. A method of selectively switching three video input signals to a common output line comprising:

coupling a first, a second and a third switch transistor to said common output line;

applying said three video signals to said first second and third switch transistors, respectively; and establishing a high, low or open voltage condition on a single control line for selectively operating said first, second and third switch transistors to couple a respective one of said video input signals to said common output line.

2. The method of claim 1, further comprising;

establishing the voltage condition on said single control line with a microprocessor.

3. The method of claim 1, further comprising:

providing three transistor arrangements for operating corresponding ones of said first, second and third switch transistors responsive to said high, low and open voltage conditions.

4. A video switch for selectively switching among three video signals to a common output line comprising:

a control line;

first, second and third switch transistors coupled to said common output line;

means for coupling said three video signals to said first, second and third switch transistors, respectively; and means for establishing a high, low or open voltage condition on said control line for selectively operating said first, second and third switch transistor to couple corresponding ones of said three video signals to said common output line.

5. The video switch of claim 4, further including:

three transistor arrangements for operating corresponding ones of said first, second and third switch transistors coupled to said control line, each of said three transistor arrangements being responsive to a corresponding one of said high, low and open voltage conditions for operating its associated one of said first, second and third switch transistors.

6. The video switch of claim 5, wherein the one of said three transistor arrangements responsive to said open voltage condition includes two cascaded transistors supplying a third transistor for enabling one of said first, second and third switch transistors and disabling the other two of said first, second and third switch transistors.

\* \* \* \* \*